(12) United States Patent
Abadeer et al.

(10) Patent No.: US 7,253,066 B2
(45) Date of Patent: Aug. 7, 2007

(54) MOSFET WITH DECOUPLED HALO BEFORE EXTENSION

(75) Inventors: Wagdi W. Abadeer, Jericho, VT (US); Jeffrey S. Brown, Middlesex, VT (US); Kiran V. Chatty, Williston, VT (US); Robert J. Gauthier, Jr., Hinesburg, VT (US); Carl J. Radens, LaGrangeville, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 149 days.

(21) Appl. No.: 10/785,895

(22) Filed: Feb. 24, 2004

(65) Prior Publication Data

US 2005/0186744 A1 Aug. 25, 2005

(51) Int. Cl.
*H01L 21/336* (2006.01)
(52) U.S. Cl. ........................... 438/303; 438/306
(58) Field of Classification Search ............... 438/197, 438/199, 299, 301, 303, 306, 585, 595
See application file for complete search history.

(56) References Cited

U.S. PATENT DOCUMENTS

| | | | | |
|---|---|---|---|---|
| 5,175,119 A * | 12/1992 | Matsutani | ............ | 438/290 |
| 5,182,619 A | 1/1993 | Pfiester | | |
| 5,210,435 A | 5/1993 | Roth et al. | | |
| 5,241,203 A | 8/1993 | Hsu et al. | | |
| 5,374,575 A * | 12/1994 | Kim et al. | ............ | 438/291 |
| 5,583,067 A | 12/1996 | Sanchez | | |
| 5,597,586 A | 1/1997 | Wilson et al. | | |
| 5,654,218 A | 8/1997 | Lee | | |
| 5,837,588 A | 11/1998 | Wu | | |
| 5,869,374 A | 2/1999 | Wu | | |
| 5,986,305 A | 11/1999 | Wu | | |
| 6,130,135 A | 10/2000 | Wu | | |
| 6,190,961 B1 | 2/2001 | Lam et al. | | |
| 6,674,139 B2 * | 1/2004 | Mandelman et al. | ........ | 257/412 |
| 2003/0020125 A1 | 1/2003 | Mandelman et al. | | |

OTHER PUBLICATIONS

Chen et al., "Self-Aligned Silicided Inverse-T Gate LDD Devices for Sub-half Micron CMOS Technology", IEDM, 1990. Technical Digest, International, 9-12 Dec. 19, pp. 829-832.

* cited by examiner

*Primary Examiner*—Carl Whitehead, Jr.
*Assistant Examiner*—Heather A. Doty
(74) *Attorney, Agent, or Firm*—Eric Petraske, Esq.; Joseph P. Abate, Esq.

(57) ABSTRACT

An inverse-T transistor is formed by a method that decouples the halo implant, the deep S/D implant and the extension implant, so that the threshold voltage can be set by adjusting the halo implant without being affected by changes to the extension implant that are intended to alter the series resistance of the device. Formation of the inverse-T structure can be made by a damascene method in which a temporary layer deposited over the layer that will form the cross bar of the T has an aperture formed in it to hold the gate electrode, the aperture being lined with vertical sidewalls that provide space for the ledges that form the T. Another method of gate electrode formation starts with a layer of poly, forms a block for the gate electrode, covers the horizontal surfaces outside the gate with an etch-resistant material and etches horizontally to remove material above the cross bars on the T, the cross bars being protected by the etch resistant material.

5 Claims, 6 Drawing Sheets

MOSFET WITH DECOUPLED HALO BEFORE EXTENSION

BACKGROUND OF INVENTION

The field of the invention is that of MOSFET integrated circuit processing with field effect transistors having short channel widths and also having excellent punchthrough characteristics, and which can be realized with a VLSI manufacturable process.

In order to fabricate future complex integrated circuits, the basic building block of integrated circuits, the transistor, must become smaller. Smaller metal oxide semiconductor (MOS) transistors are formed by decreasing the channel length of the transistor. Future MOS transistors will have channel lengths of less than 30 nm.

Those skilled in the art are aware of a number of problems that become more difficult is the channel length decreases, referred to generally as short channel effects.

A particular problem in transistor fabrication is the ability to adjust the threshold Vt and also the on-resistance (series resistance) of the transistor. In conventional practice, the two are linked, so that it is not possible to set the values of the two quantities independently.

Conventionally, the halo implant is performed with the wafer tilted so that the implanted ions penetrate underneath the gate. In practice, this method increases the capacitance of the device when the diffusion of the extension implant is greater than estimated and also affects the series resistance of the device.

In particular, a problem with manufacturing such small channel devices is that the punchthrough voltage of these transistors decreases to an unacceptable level.

The punchthrough voltage of a device is the drain voltage that causes the drain depletion region of the device to extend into the source depletion region. When this occurs the transistor conducts regardless of the gate voltage. This eliminates the ability of the transistor to act as a switch, i.e. to switch "on" and "off". MOS transistors of less than 400 nm gate length cannot be fabricated without adjusting to some degree the process recipe to raise the punchthrough voltage of the device.

Presently the main technique for adjusting the punchthrough voltage and threshold voltage of short channel MOSFET transistors is the halo implant, in which a second implant of the same polarity of the transistor body is made to increase the dopant concentration at the edge of the source and drain and thereby reduce the depletion region. These implants are often made with the wafer oriented at a large tilt with respect to the implanting ions. This implant forms higher concentration P type regions (using an NFET as an example unless otherwise stated) under the gate to prevent bulk punchthrough. This implant is generated by tilting and rotating the wafer as the implant occurs. The dosage is small enough compared with the dose in the source and drain that they are not affected. The gate acts to block the halo dose from reaching the bulk of the transistor body and confines it to the edge of the body in a small region near the low-doped (LDD) region of the source and drain.

Halo transistors exhibit several undesirable features. First, the P implants do not surround the entire drain. This requires wells to be deeper to prevent punchthrough leading to a reduction in packing densities. Second, the doping uniformity is dependent on the placement, shape, and layout of the fabricated transistor, since the implanted ions will be blocked by neighboring structures. As dimensions shrink, the aspect ratio of the gap between neighboring devices increases and the degree of blocking the implant also increases. Additionally, the halo technique requires very specialized, and expensive equipment which increase the cost of applying the method.

Thus, what is needed is a reliable submicron transistor which exhibits excellent punchthrough characteristics without sacrificing other device performance characteristics and which can be fabricated with a VLSI manufacturable process.

SUMMARY OF INVENTION

The invention relates to a method of forming a FET with a halo implant that does not use an angled implant.

A feature of the invention is the use of the ledges on an inverse-T gate electrode to provide the alignment of a self-aligned halo implant.

Another feature of the invention is the separation of the deep source/drain (S/D) implant from the halo implant and from the S/D extension implant.

Yet another feature of the invention is a method of forming an inverse-T gate electrode by etching the gate structure laterally while the ledge area is protected, thereby carving out the ledges from the gate electrode structure.

Yet another feature of the invention is the formation of an inverse-T gate electrode by a damascene technique in which the electrode is deposited in an aperture in a temporary layer.

DETAILED DESCRIPTION

Figure 5:
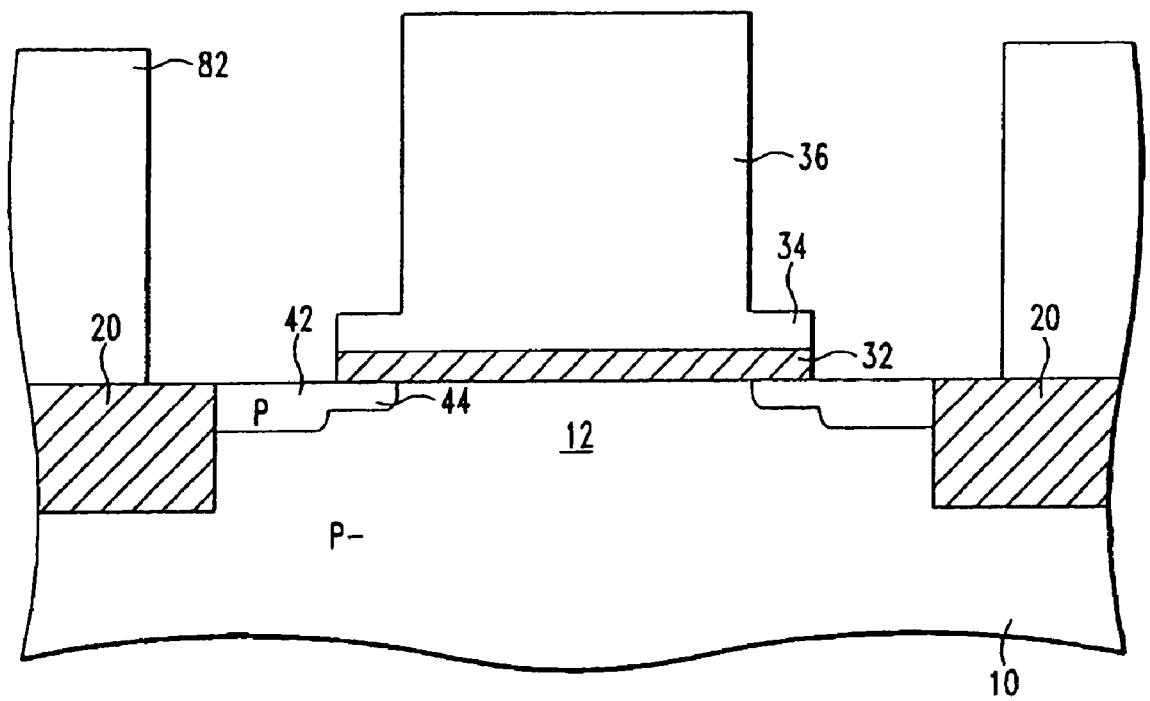
FIG. 5 the result of a preliminary step of implanting the halo area in the inventive method.

FIG. 5 illustrates a step in a process according to the invention. At the center of the Figure, an inverse-T gate electrode 36 has been formed by any convenient method, such as those discussed below. Electrode 36 has a set of ledges 34 that project to the side by a ledge distance. Unless otherwise indicated, a reference to the gate will include the ledges. In the example, adapted for the 30 nm node, gate 36 has a length of 30 nm and ledges 34 extend by 5 nm to 30 nm, preferably 10 nm out from electrode 36. Ledges 34 have a nominal thickness of 10 nm. Illustratively, the ledges 34 are formed over a transistor axis extending in the plane of the paper and the sides of the gate before and behind the paper do not have ledges. Other variations having ledges on all four sides of the gate are possible.

Composite electrode 36 rests on a gate dielectric 32, illustratively thermal oxide. The Figure shows the result of applying a halo implant to form halo 44. In the example shown, the transistor is an N-FET having a body 12 that is P-type and the halo is also P. Those skilled in the art will be aware of conventional magnitudes applying to the P body and to the P halo and will readily be able to adapt the invention to PFETs. The halo implant has been applied by a vertical implant, avoiding the well known problems associated with angled implants. Since the inner portion of the self-aligned halo implant has passed through the ledges 34, the ions have lost energy and consequently, the ions closer in to the gate penetrate into the body 12 to a lesser degree. The depth of the halo in the shallower area will be referred to as the halo depth.

On the right and left of the Figure, isolating members 20 have been formed be etching a trench and filling it with dielectric, e.g. oxide ($SiO_2$). Also on the extreme edges of the Figure, a photoresist mask 82 has had an aperture formed in it that blocks the implant in other regions where it is not desired. The substrate 10 in which the transistor is being formed may be bulk or SOI.

Figure 6:
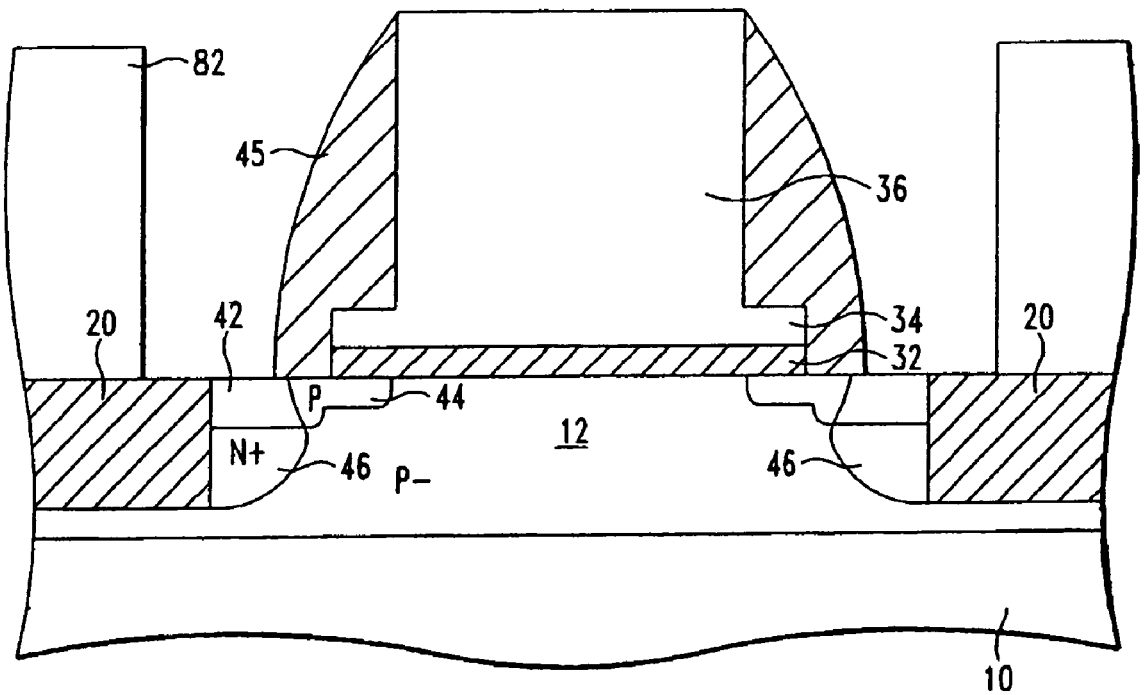
FIG. 6 the result of implanting the deep S/D area in the inventive method.

FIG. 6 shows the result of the next stage, in which a set of temporary disposable spacers 45 have been formed by a conventional technique of depositing a conformal oxide layer and then directionally etching the horizontal portions of the layer. The thickness of the layer is set such that the sidewalls extend horizontally past the ledges by some margin. A conventional source/drain (S/D) implant 46 has been formed to a greater depth than the halo implant. The S/D has an upper portion 42 where the dopant concentration of the S/D has been reduced by the effect of the halo and a lower portion 46 that is N+. The magnitude of the S/D implant dose is chosen relative to the halo implant so that the resistivity of the S/D is reduced to a desired amount. One of the benefits of the present invention is that the various implants are decoupled, so that the resistivity of the transistor in the on state can be set without being adversely affected by the halo. The spacers 45 are stripped at any convenient time, e.g. before the following step. Also, the thermal step of activating the S/D and halo implants is performed before the extension implant that will follow.

Figure 7:
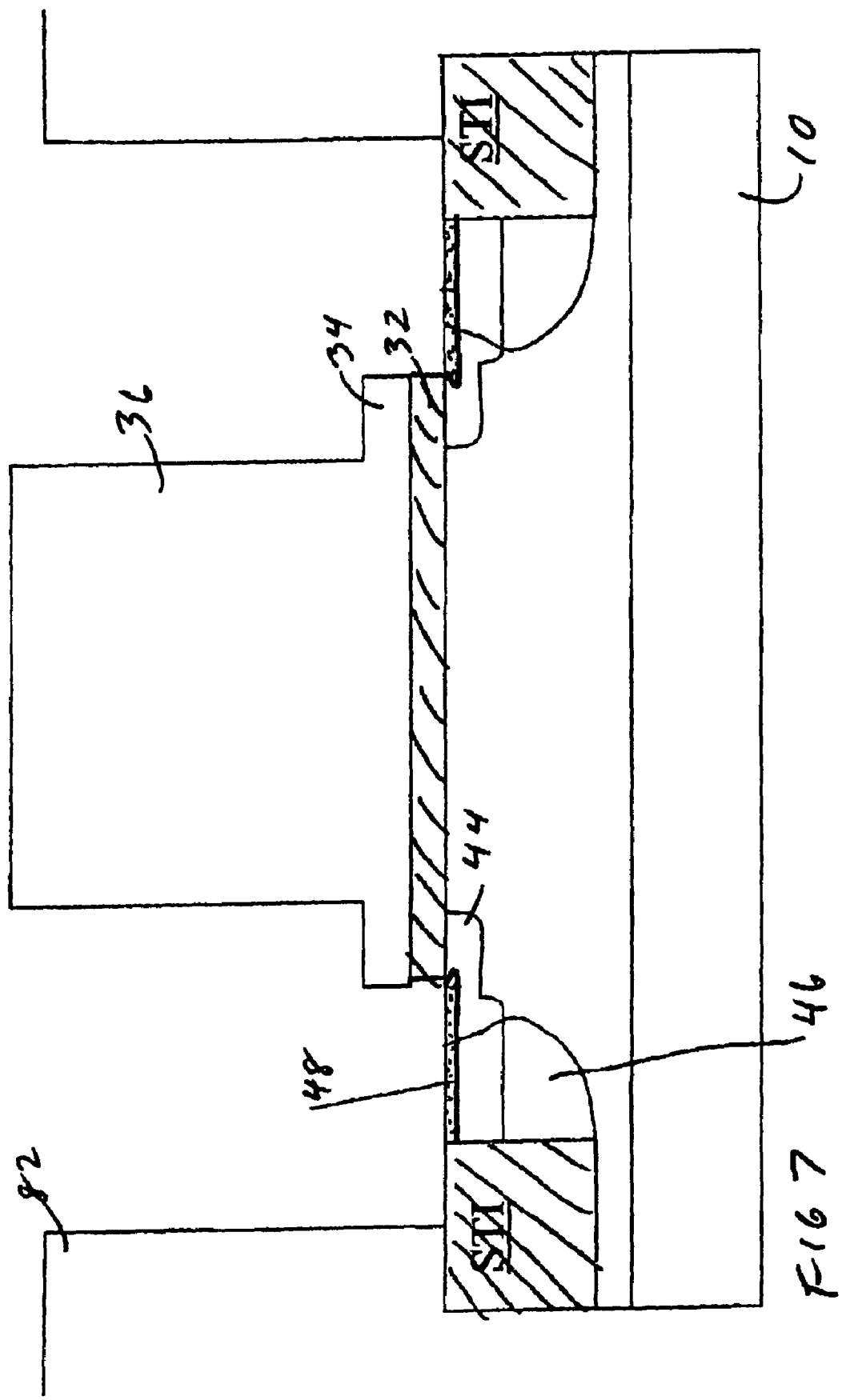
FIG. 7 the result of implanting the shallow extension implant area in the inventive method.

FIG. 7 illustrates the result of forming the final implant, which forms the extension of the S/D, referred to as the extension implant. It can be seen in FIGS. 6 and 7 that the horizontal extent of the N+ implant was set by the width of the spacers, leaving an area between the N+ implant of the S/D and the ledge that is P-type. The extension implant counterdopes the silicon in that area, resulting in a final dopant concentration suitable for a LDD structure as is known to those skilled in the art The energy of the extension implant is selected such that it does not penetrate the leaving the halo implant beneath the ledges unaffected. The extension implant, since it is shallow, is activated by a rapid thermal anneal (RTA) step, such as nominally 900° C. for 5 seconds.

It is an advantageous feature of the invention that the halo and the extension are decoupled. They are set by different implant steps and are physically separated. Thus, the VT of the transistor, as affected by the halo implant, is not affected by the extension implant, which affects the on-resistance of the transistor and the hot-electron effects.

Figure 8:
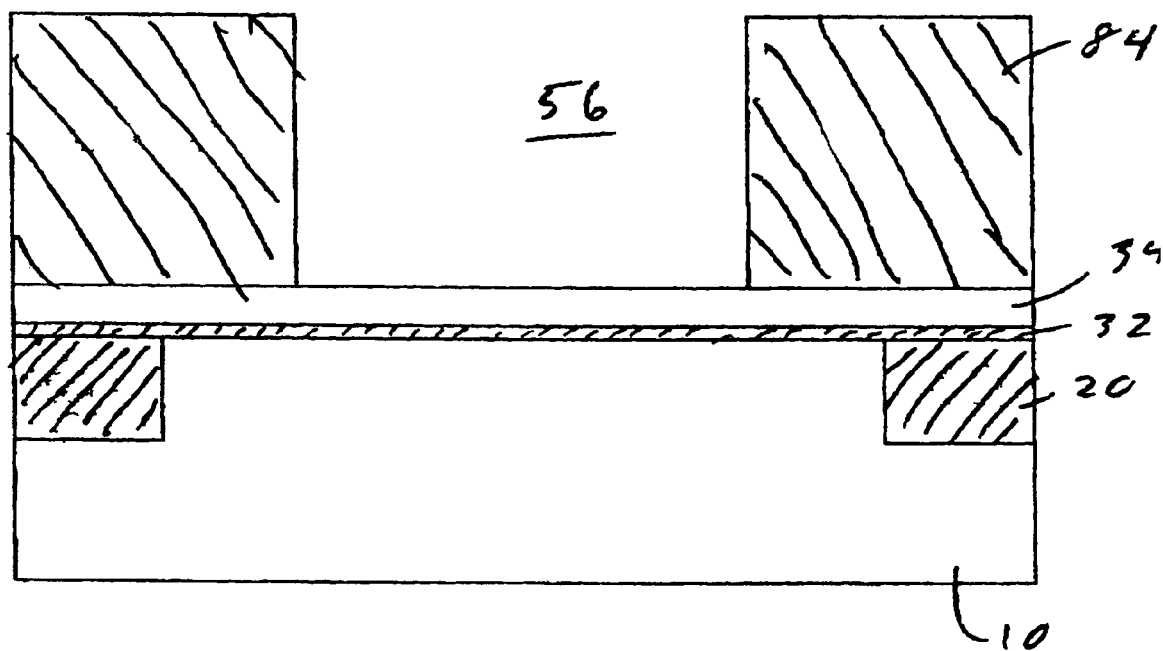
FIG. 8 shows an initial step in an alternative method of forming an inverse-T gate electrode.

FIG. 8 illustrates a step in forming an inverse-T transistor that may be used with the previous method. A substrate 10 has STI isolation members 20 bounding a body area as before. A gate electrode layer 32, illustratively thermal oxide, has been grown and a ledge layer 34, illustratively polysilicon, that will form the ledges of the inverted T structure has been deposited. A nitride layer 84 has been put down to a depth suitable for the gate electrode, e.g. 10 nm to 100 nm, preferably 50 nm and an aperture 56 has been formed in the nitride layer, extending down to the ledge layer using conventional photolithography and dry etching.

Figure 9:
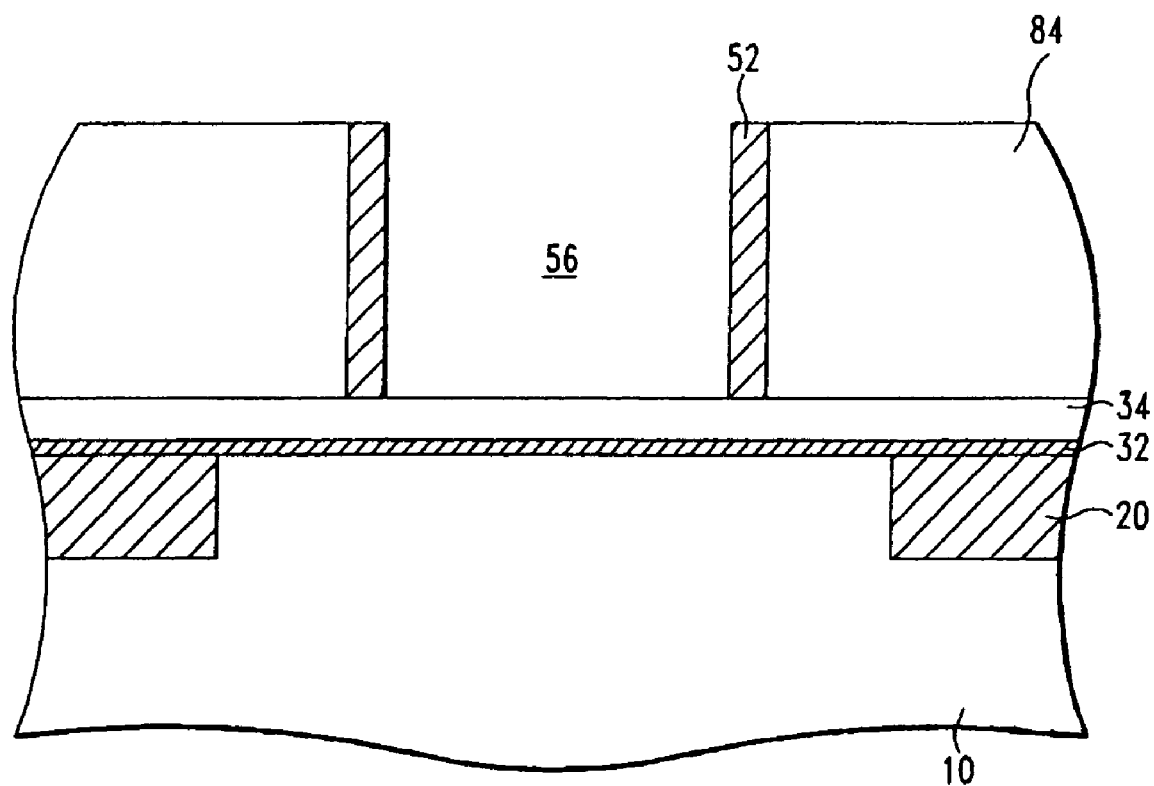
FIG. 9 shows the result of an intermediate step of forming the vertical sidewalls in the damascene aperture in the alternative method of forming an inverse-T gate electrode.

In FIG. 9, vertical oxide spacers 52 have been formed according to the technique taught in U.S. Pat. No. 6,190,961. The thickness of these spacers will define the extent of the projection of the ledges in the final transistor. Such a vertical spacer is preferred, but not necessary, and a conventional spacer process may also be used. After spacer 52 have been formed, the remaining portion of the aperture is filled with poly by chemical vapor deposition (CVD) and chemical mechanical polish (CMP).

Figure 10:
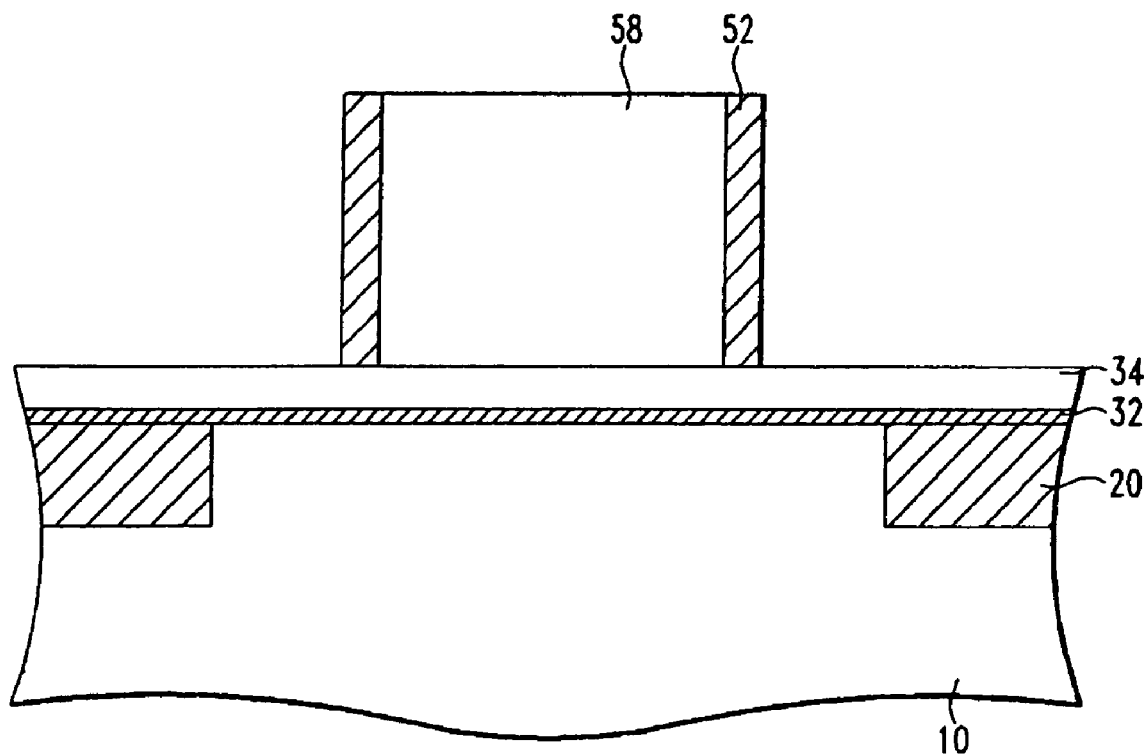
FIG. 10 shows the result of another intermediate step of removing the temporary layer that supported forming the vertical sidewalls in the alternative method of forming an inverse-T gate electrode.

The nitride damascene layer is stripped by selective etching such as a hot phosphoric acid wet etch, leaving the structure shown in FIG. 10 having a central electrode 58 bracketed by the vertical spacers.

Figure 11:
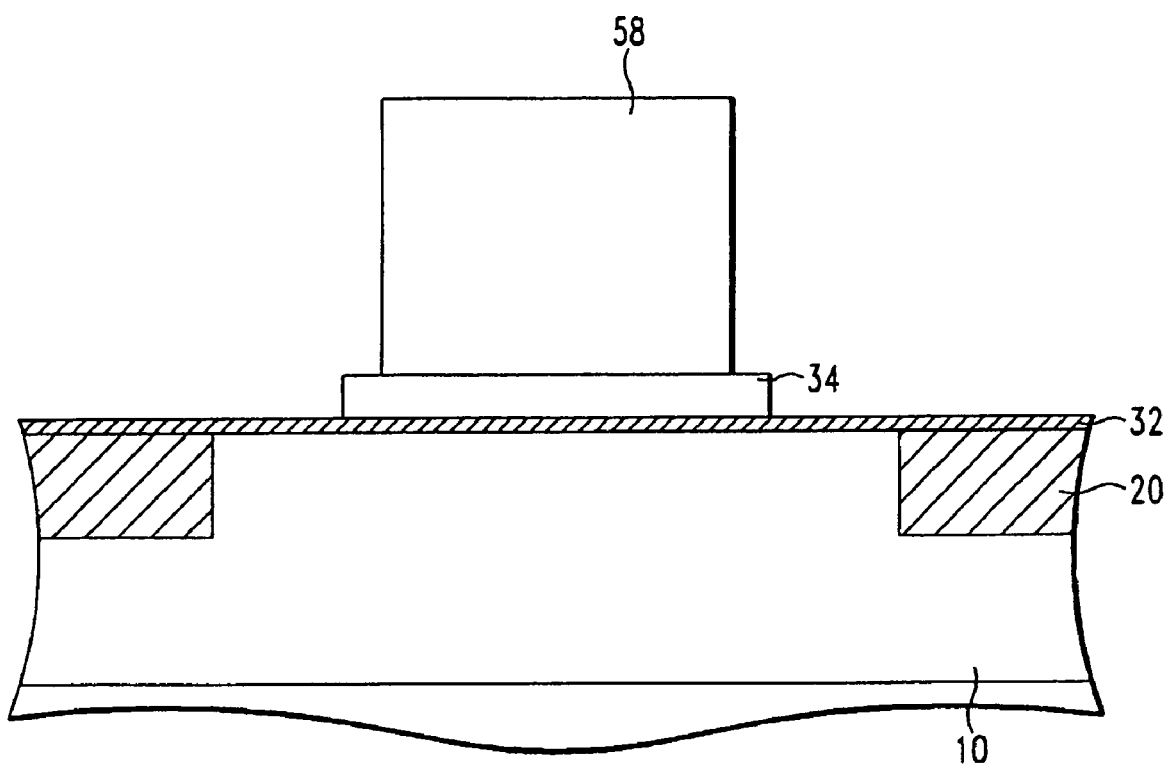
FIG. 11 shows the result of the alternative method.

A selective anisotropic directional etch trims off the ledges to the width of the spacers 52, after which the spacers are stripped, leaving the final structure shown in FIG. 11. The S/D and halo may then be formed according to the previous example or with an alternative technique.

Another technique for forming an inverse-T electrode transistor is illustrated in FIGS. 1–4.

Figure 1:
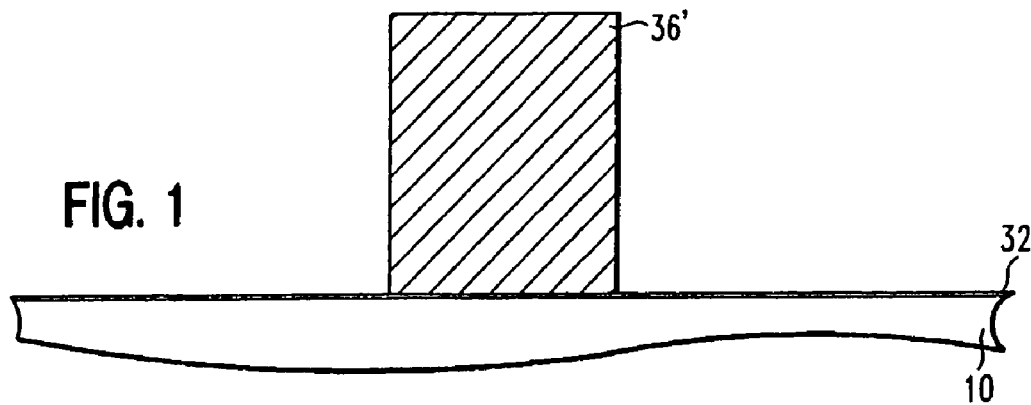
FIG. 1 shows an initial step in forming an inverse-T gate electrode.

FIG. 1 shows an initial structure in which a substrate 10 has had a gate oxide 32 grown on it and a poly layer has been put down and patterned to form a first gate structure 36'.

Figure 2:
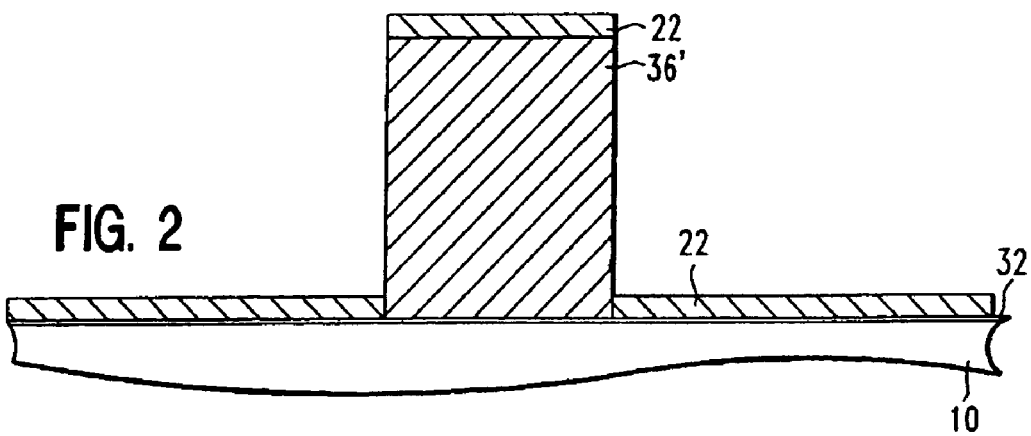
FIG. 2 shows an intermediate step in forming an inverse-T gate electrode.
Figure 3:
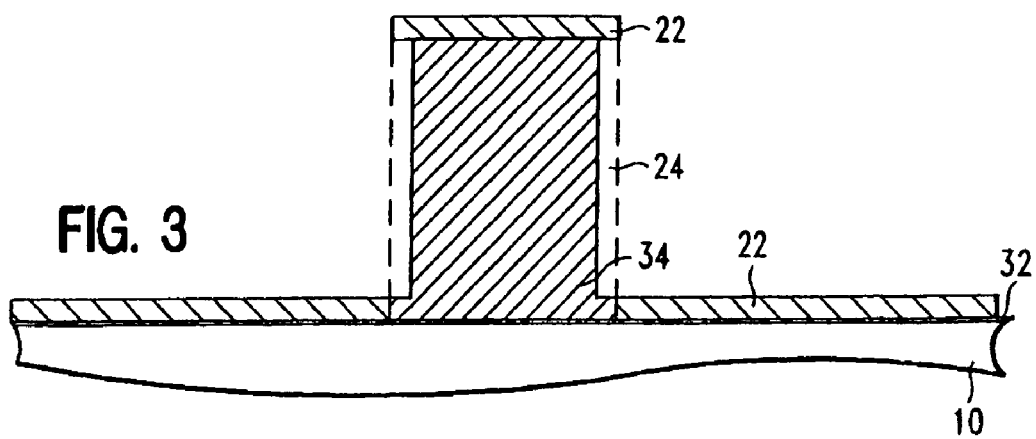
FIG. 3 shows the result of the etching step in forming an inverse-T gate electrode.

A HDP oxide layer 22 having a thickness suitable for the thickness of the transistor ledges has been put down on the horizontal surfaces. If the deposition step leaves some oxide adhering to the vertical edges of the gate, that may be cleaned up in an isotropic etch. The result is shown in FIG. 2.

A wet etch or other isotropic etch removes poly from gate 36' to an amount indicated by dotted lines 24, leaving a ledge 34 on the bottom where the horizontal etching action has been blocked by the blocking layer 22.

Figure 4:
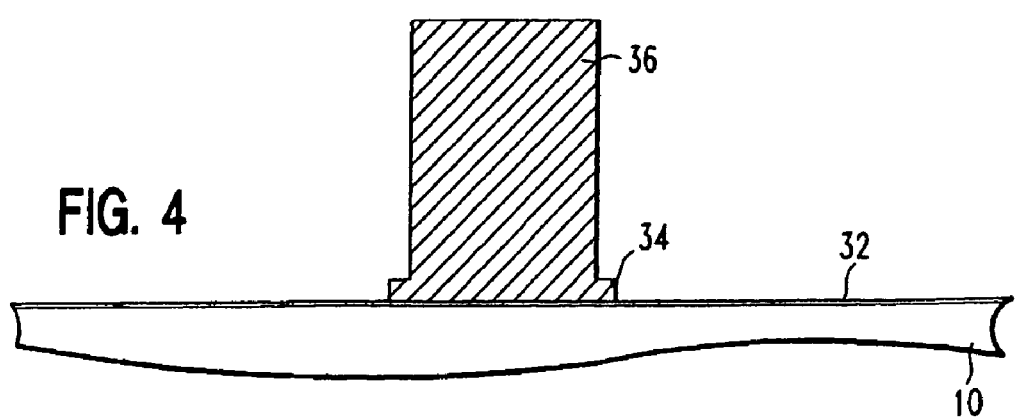
FIG. 4 shows the resulting inverse-T gate electrode.

The final result is shown in FIG. 4, with the final gate 36 having the ledges 34 defined by the horizontal etching step.

While the invention has been described in terms of a single preferred embodiment, those skilled in the art will recognize that the invention can be practiced in various versions within the spirit and scope of the following claims.

The invention claimed is:

1. A method of forming at least one field effect transistor having an inverse-T gate structure with at least two ledges extending along a transistor axis from the sides of a central gate structure by a ledge distance, comprising the steps of:

forming a gate dielectric on a portion of a semiconductor substrate having a first polarity; and forming a gate electrode disposed above the gate dielectric and having an inverse-T structure;

in which said step of forming a gate electrode comprises the steps of:

forming a gate dielectric on a semiconductor substrate having a first polarity:

depositing a ledge layer of a first material over said gate dielectric;

depositing a temporary layer of a second material over said gate dielectric;

forming a first damascene aperture having vertical interior walls and extending down to said ledge layer in said temporary layer;

forming a set of vertical spacers of a third material different from said second material on said interior walls of said damascene aperture, thereby forming a second damascene aperture;

forming a gate electrode disposed above the ledge layer in said second damascene aperture;

stripping the vertical spacers and thereby forming an inverse T gate electrode from the gate electrode and the ledge layer;

implanting a halo implant of said first polarity and a halo concentration in the substrate on opposite sides of the gate electrode, self-aligned to the central gate structure and passing through said ledges to a halo depth;

forming a pair of disposable spacers adjacent to said central gate structure and extending past said ledge distance over a portion of the halo implant;

implanting a self-aligned S/D region of a second polarity opposite said first polarity in the substrate and self-aligned to said disposable spacers, said S/D region having a concentration greater than said halo concentration and having a S/D depth greater than said halo depth;

activating the S/D implant;

implanting in the substrate an extension implant of said second polarity self-aligned to said ledges; and activating the extension implant.

2. A method according to claim 1, further comprising a step of stripping said temporary layer before stripping said spacers.

3. A method according to claim 1, in which said temporary material is such that it can be removed without damaging the gate electrode; and said third material is such that it can be removed without damaging the gate electrode.

4. A method according to claim 3, in which said step of implanting said extension implant is effected with an energy such that the implant does not penetrate through the ledges, whereby the halo implant is located beneath the ledges.

5. A method according to claim 1, in which said step of implanting said extension implant is effected with an energy such that the implant does not penetrate through the ledges, whereby the halo implant is located beneath the ledges.

* * * * *